(12) United States Patent
Lai et al.

(10) Patent No.: US 11,869,854 B2
(45) Date of Patent: Jan. 9, 2024

(54) SEMICONDUCTOR STRUCTURE FORMED WITH INDUCTANCE ELEMENTS

(71) Applicant: UNITED MICROELECTRONICS CORPORATION, Hsinchu (TW)

(72) Inventors: Chien-Ming Lai, Tainan (TW); Hui-Ling Chen, Kaohsiung (TW); Zhi-Rui Sheng, Singapore (SG)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 389 days.

(21) Appl. No.: 17/159,181

(22) Filed: Jan. 27, 2021

(65) Prior Publication Data

US 2022/0189888 A1  Jun. 16, 2022

(30) Foreign Application Priority Data

Dec. 11, 2020  (CN) .......................... 202011457034.5

(51) Int. Cl.
*H01L 23/64* (2006.01)
*H01L 23/522* (2006.01)
*H01L 23/00* (2006.01)

(52) U.S. Cl.
CPC ........ *H01L 23/645* (2013.01); *H01L 23/5227* (2013.01); *H01L 24/94* (2013.01); *H01L 24/80* (2013.01); *H01L 24/83* (2013.01); *H01L 2224/32245* (2013.01); *H01L 2224/48139* (2013.01)

(58) Field of Classification Search
CPC ... H01L 23/645; H01L 23/5227; H01L 24/94; H01L 23/64; H01L 23/00; H01L 23/522; H01L 25/50; H01L 2224/808; H01L 24/05; H01L 2224/80009; H01L 2224/80895; H01L 2224/80896; H01L 2224/94; H01L 2224/05569; H01L 2224/80948; H01L 2924/19042; H01L 2224/8082; H01L 2224/80097; H01L 2224/80906; H01L 2224/80001; H01L 24/08; H01L 24/80; H01L 2224/08145; H01L 2224/8083;
(Continued)

(56) References Cited

U.S. PATENT DOCUMENTS 7,436,683 B2   10/2008 Shen
10,535,635 B2   1/2020 Chen et al.
(Continued)

FOREIGN PATENT DOCUMENTS

CH   209001093 U  *  6/2019  ................ H01P 1/20
CN   109216316 B  *  9/2020  ......... H01L 23/5227
(Continued)

*Primary Examiner* — Patricia D Valenzuela

(57) ABSTRACT

A semiconductor structure in which the upper and lower semiconductor wafers are bonded by a hybrid bonding method is provided. The two semiconductor wafers each have discontinuous multiple metal traces or spiral coil-shaped metal traces. By hybrid bonding the two semiconductor wafers, multiple discontinuous metal traces are bonded together to form an inductance element with a continuous and non-intersecting path, or the two spiral coil-shaped metal traces are bonded together to form an inductance element. In this semiconductor structure, the inductance element formed by hybrid bonding has the advantage that the inductance value is easily adjusted.

11 Claims, 6 Drawing Sheets

(58) Field of Classification Search
CPC ... H01L 25/0657; H01L 24/83; H01F 27/303; H01F 17/0013; H01F 2017/004
USPC .......................................................... 257/531
See application file for complete search history.

(56) References Cited

U.S. PATENT DOCUMENTS

| | | | |
|---|---|---|---|
| 2015/0108644 A1* | 4/2015 | Kuang | H01L 25/50 257/777 |
| 2016/0351321 A1* | 12/2016 | Lyoo | H01F 41/041 |
| 2020/0402951 A1* | 12/2020 | Chen | H01L 24/03 |
| 2021/0028151 A1* | 1/2021 | Li | H01L 24/83 |
| 2022/0093567 A1* | 3/2022 | Kim | H01L 25/0655 |
| 2022/0262752 A1* | 8/2022 | Lai | H01L 23/5227 |

FOREIGN PATENT DOCUMENTS

| | | | | |
|---|---|---|---|---|
| CN | 111817016 A | * | 10/2020 | ....... H01Q 15/00013 |
| WO | 2016002737 A1 | * | 1/2016 | ............... H03H 9/72 |

* cited by examiner

SEMICONDUCTOR STRUCTURE FORMED WITH INDUCTANCE ELEMENTS

FIELD OF THE INVENTION

The present invention relates to a semiconductor structure, and more particularly to a semiconductor structure formed with inductance elements.

BACKGROUND OF THE INVENTION

A three-dimensional integrated circuit (3DIC) is the latest development of semiconductor packaging, in which a plurality of semiconductor dies are stacked by packaging technology such as package-on-package (PoP) or system-in-package (SiP). Some three-dimensional integrated circuits are formed by stacking semiconductor wafers or dies and using through silicon via (TSV) or Cu—Cu connections to form electrical connections in the vertical direction. Compared with the planar process in prior art, 3D semiconductor devices can not only reduce the occupied area, but also reduce power loss and improve performance.

A hybrid bonding technology is to perform a planarization process on the upper and lower wafers first, and then make the planarized surfaces of the upper and lower wafers contact each other and maintain relative alignment, and then activate the upper and lower wafers to assist the bonding of the upper and lower wafers, and then provide heat treatment and contact pressure to the wafer assembly, and then perform an annealing process to hybrid bond the upper and lower wafers.

Among the various technologies used to stack semiconductor wafers, hybrid bonding technology is currently a project that the industry pays attention to and is actively developed because it can form a high-density electrical connection structure.

SUMMARY OF THE INVENTION

The present invention provides a semiconductor structure, which forms an inductance element with a continuous and non-intersecting path in a hybrid bonding manner, so that the inductance element can produce a required inductance value.

The semiconductor structure provided by the present invention includes a first semiconductor wafer and a second semiconductor wafer. The first semiconductor wafer includes a first semiconductor substrate and a first inductance layer. The first inductance layer is disposed on the first semiconductor substrate. One side of the first inductance layer away from the first semiconductor substrate has a first bonding surface. The first inductance layer includes a first metal trace, a first interconnect structure and a first insulating layer. The first insulating layer covers the first metal trace. The first interconnect structure is embedded in the first insulating layer and electrically connected to the first metal trace. The second semiconductor wafer includes a second semiconductor substrate and a second inductance layer. The second inductance layer is disposed on the second semiconductor substrate. One side of the second inductance layer away from the second semiconductor substrate has a second bonding surface. The second inductance layer includes a second metal trace, a second interconnect structure and a second insulating layer. The second insulating layer covers the second metal trace. The second interconnect structure is embedded in the second insulating layer and electrically connected to the second metal trace. The first semiconductor wafer and the second semiconductor wafer are coupled to each other. The first bonding surface of the first inductance layer is bonded to the second bonding surface of the second inductance layer. The first insulating layer on the first bonding surface and the second insulating layer on the second bonding surface form a first bond. The first interconnect structure on the first bonding surface and the second interconnect structure on the second bonding surface form a second bond.

In one embodiment of the present invention, the first metal trace has an input terminal and a first terminal. The second metal trace corresponds to the first metal trace. The second metal trace has a connection terminal and a second terminal.

In one embodiment of the present invention, the first interconnect structure is electrically connected to the first terminal. The second interconnect structure is electrically connected to the connection terminal. The second bond is formed by the second interconnect structure and the first interconnect structure. The first metal trace, the first interconnect structure, the second metal trace and the second interconnect structure form a continuous and non-intersecting path between the input terminal and the second terminal and constitute an inductance element.

In one embodiment of the present invention, the first metal trace includes a first coil spiraling inward from the input terminal to the first terminal. The second metal trace includes a second coil spiraling outward from the connection terminal to the second terminal. The second terminal functions as an output terminal.

In one embodiment of the present invention, the first metal trace includes a first coil spiraling outward from the input terminal to the first terminal. The second metal trace includes a second coil spiraling inward from the connection terminal to the second terminal. The second terminal functions as an output terminal.

In one embodiment of the present invention, the first coil and the second coil are arranged correspondingly, and the first coil and the second coil have a same current flow direction.

In one embodiment of the present invention, the first interconnect structure and the first metal trace are integrally formed, and the second interconnect structure and the second metal trace are integrally formed.

The semiconductor structure provided by the present invention includes a first semiconductor wafer and a second semiconductor wafer. The first semiconductor wafer includes a first semiconductor substrate and a first inductance layer. The first inductance layer is disposed on the first semiconductor substrate. One side of the first inductance layer away from the first semiconductor substrate has a first bonding surface. The first inductance layer includes a start metal trace, a first metal trace, a first interconnect structure and a first insulating layer. The start metal trace and the first metal trace are arranged side by side. The start metal trace has an input terminal and a first terminal. Each of the first metal traces has a first connection terminal and a second connection terminal. The first insulating layer covers the start metal trace and the first metal trace. The first interconnect structure is embedded in the first insulating layer. The first terminal, each of the first connection terminals, and each of the second connection terminals are each electrically connected to one of the first interconnect structures. The second semiconductor wafer includes a second semiconductor substrate and a second inductance layer. The second inductance layer is disposed on the second semiconductor substrate. One side of the second inductance layer away from the second semiconductor substrate has a second bonding surface. The second inductance layer includes a second metal trace, a second interconnect structure and a second insulating layer. The second metal traces are arranged side by side. The second metal trace has a third connection terminal and a fourth connection terminal. The second insulating layer covers the second metal trace. The second interconnect structure is embedded in the second insulating layer. The third connection terminal and the fourth connection terminal are each electrically connected to one of the second interconnect structures. The first semiconductor wafer and the second semiconductor wafer are coupled to each other. The first bonding surface of the first inductance layer is bonded to the second bonding surface of the second inductance layer. The first insulating layer on the first bonding surface and the second insulating layer on the second bonding surface form a first bond. The first interconnect structure on the first bonding surface and the second interconnect structure on the second bonding surface form a second bond. The start metal trace, the first metal trace, the first interconnect structure, the second metal trace and the second interconnect structure form a multi-circle continuous and non-intersecting path and constitute an inductance element.

In one embodiment of the present invention, the first inductance layer further includes an end metal trace. The end metal trace and the first metal trace are arranged side by side. One end of the end metal trace is electrically connected to the one of the second metal traces farthest from the start metal trace, and the other end of the end metal trace functions as an output terminal, so that the start metal trace, the first metal trace, the first interconnect structure, the second metal trace, the second interconnect structure and the end metal trace form a multi-circle continuous and non-intersecting path between the input terminal and the output terminal.

In one embodiment of the present invention, the second inductance layer further includes an end metal trace. The end metal trace and the second metal trace are arranged side by side. One end of the end metal trace is electrically connected to the one of the second metal traces farthest from the start metal trace, and the other end of the end metal trace functions as an output terminal, so that the start metal trace, the first metal trace, the first interconnect structure, the second metal trace, the second interconnect structure and the end metal trace form a multi-circle continuous and non-intersecting path between the input terminal and the output terminal.

In one embodiment of the present invention, the first metal trace is L-shaped and includes a first long side, a first short side, and a first bending portion formed between the first long side and the first short side. The first short side extends along a first direction. The first connection terminal is located at an end of the first long side away from the first bending portion, and the second connection terminal is located at an end of the first short side away from the first bending portion.

In one embodiment of the present invention, a shape of the second metal trace corresponds to that of the first metal trace and is arranged backwards with the first metal trace. The second metal trace includes a second long side, a second short side, and a second bending portion formed between the second long side and the second short side. The second short side extends along a second direction opposite to the first direction. The third connection terminal is located at an end of the second long side away from the second bending portion, and the fourth connection terminal is located at an end of the second short side away from the second bending portion.

In the embodiments of the present invention, by the hybrid bonding of the first semiconductor wafer and the second semiconductor wafer, the conductive traces located on the first semiconductor wafer and the second semiconductor wafer form a continuous and non-intersecting path to form an inductance element with a continuous and non-intersecting path. In addition, the inductance element may produce the required inductance value by adjusting the quantity of discontinuous multi-segment conductive traces or the quantity of loops of the spiral conductive traces in the first semiconductor wafer and the second semiconductor wafer.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
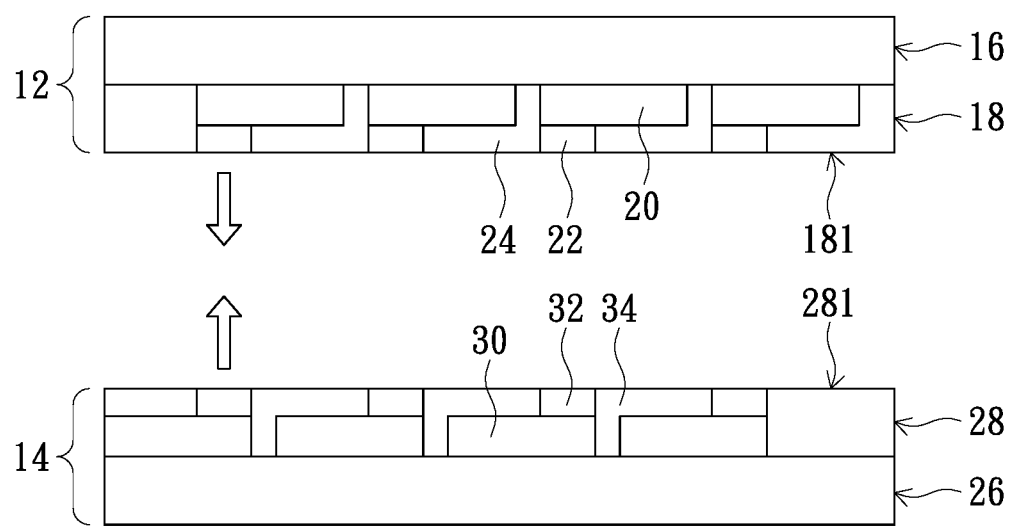
FIG. 1 is a schematic diagram of a layered cross-section of a semiconductor structure according to an embodiment of the present invention.
Figure 2:
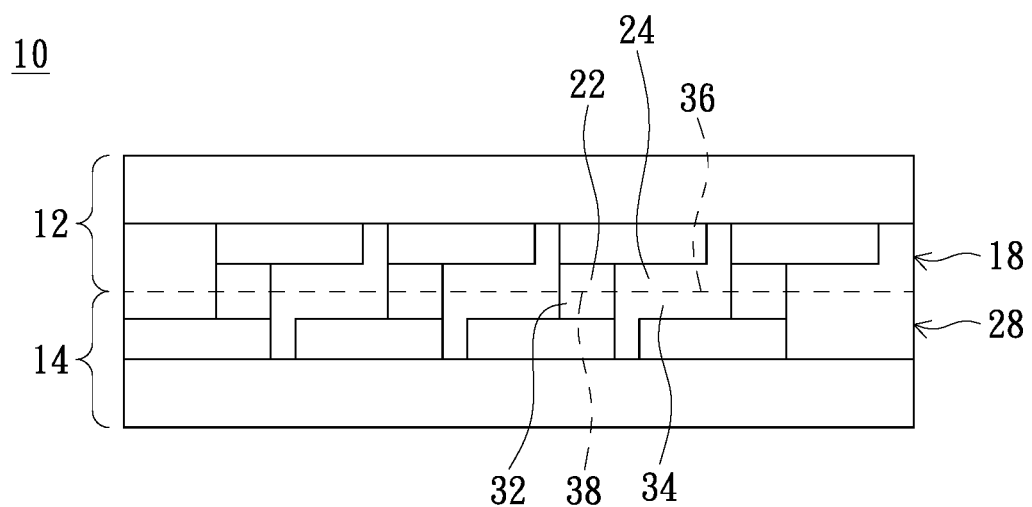
FIG. 2 is a schematic cross-sectional diagram of a semiconductor structure according to an embodiment of the present invention.

FIG. 1 is a schematic diagram of a layered cross-section of a semiconductor structure according to an embodiment of the present invention. FIG. 2 is a schematic cross-sectional diagram of a semiconductor structure according to an embodiment of the present invention. As shown in FIG. 1, the semiconductor structure 10 includes a first semiconductor wafer 12 and a second semiconductor wafer 14. As shown in FIG. 2, the first semiconductor wafer 12 and the second semiconductor wafer 14 are vertically bonded by hybrid bonding.

The first semiconductor wafer 12 includes a first semiconductor substrate 16 and a first inductance layer 18. The first inductance layer 18 is disposed on the first semiconductor substrate 16. The side of the first inductance layer 18 away from the first semiconductor substrate 16 has a first bonding surface 181. The first inductance layer 18 includes a first metal trace 20, a first interconnect structure 22 and a first insulating layer 24. The first insulating layer 24 covers the first metal trace 20. The first interconnect structure 22 is embedded in the first insulating layer 24. One end of the first interconnect structure 22 is electrically connected to the first metal trace 20, and the other end of the first interconnect structure 22 is exposed on the first bonding surface 181. Correspondingly, the second semiconductor wafer 14 includes a second semiconductor substrate 26 and a second inductance layer 28. The second inductance layer 28 is disposed on the second semiconductor substrate 26. The side of the second inductance layer 28 away from the second semiconductor substrate 26 has a second bonding surface 281. The second inductance layer 28 includes a second metal trace 30, a second interconnect structure 32 and a second insulating layer 34. The second insulating layer 34 covers the second metal trace 30. The second interconnect structure 32 is embedded in the second insulating layer 34. One end of the second interconnect structure 32 is electrically connected to the second metal trace 30, and the other end of the second interconnect structure 32 is exposed on the second bonding surface 281. The material of the first insulating layer 24 and the second insulating layer 34 is silicon dioxide, for example. The material of the first metal trace 20, the second metal trace 30, the first interconnect structure 22 and the second interconnect structure 32 is copper, for example. In an embodiment, the first interconnect structure 22 and the first metal trace 20 may be integrally formed; and the second interconnect structure 32 and the second metal trace 30 may be integrally formed.

Continue the above description. As shown in FIG. 2, hybrid bonding is performed on the first semiconductor wafer 12 and the second semiconductor wafer 14, so that the first bonding surface 181 (labeled in FIG. 1) of the first inductance layer 18 is bonded to the second bonding surface 281 (labeled in FIG. 1) of the second inductance layer 28. The first insulating layer 24 on the first bonding surface 181 and the second insulating layer 34 on the second bonding surface 281 form a first bond 36. The first interconnect structure 22 on the first bonding surface 181 and the second interconnect structure 32 on the second bonding surface 281 form a second bond 38.

In an embodiment, the first semiconductor wafer 12 and the second semiconductor wafer 14 may be planarized first when the hybrid bonding is performed, and then the planarized first bonding surface 181 of the first semiconductor wafer 12 and the planarized second bonding surfaces 281 of the second semiconductor wafer 14 are arranged face-to-face and aligned. Specifically, the first interconnect structure 22 is aligned and contacts the second interconnect structure 32, and the first insulating layer 24 is aligned and contacts the second insulating layer 34. The first bonding surface 181 and the second bonding surface 281 are pre-bonded by, for example, Van der Waals force. In an embodiment, an activation process (e.g., plasma treatment) can be performed on the first bonding surface 181 and the second bonding surface 281. The activation process can assist the hybrid bonding of the first semiconductor wafer 12 and the second semiconductor wafer 14. Specifically, the activation process advantageously allows lower contact pressure and heat treatment temperature to be used in the subsequent annealing to hybrid bond the first semiconductor wafer 12 and the second semiconductor wafer 14. In an embodiment, the annealing can strengthen the bonding between the first bonding surface 181 and the second bonding surface 281. For example, the first bonding surface 181 and the second bonding surface 281 may be annealed at a temperature of 200° C. to 400° C., and the annealing may be performed for a period of 1 hour to 2 hours. During the annealing, the metals in the first interconnect structure 22 and the second interconnect structure 32 contact and then diffuse each other due to thermal expansion to form a metal-to-metal bond. The corresponding first insulating layer 24 and second insulating layer 34 can also be bonded to each other at a specified temperature.

Figure 3:
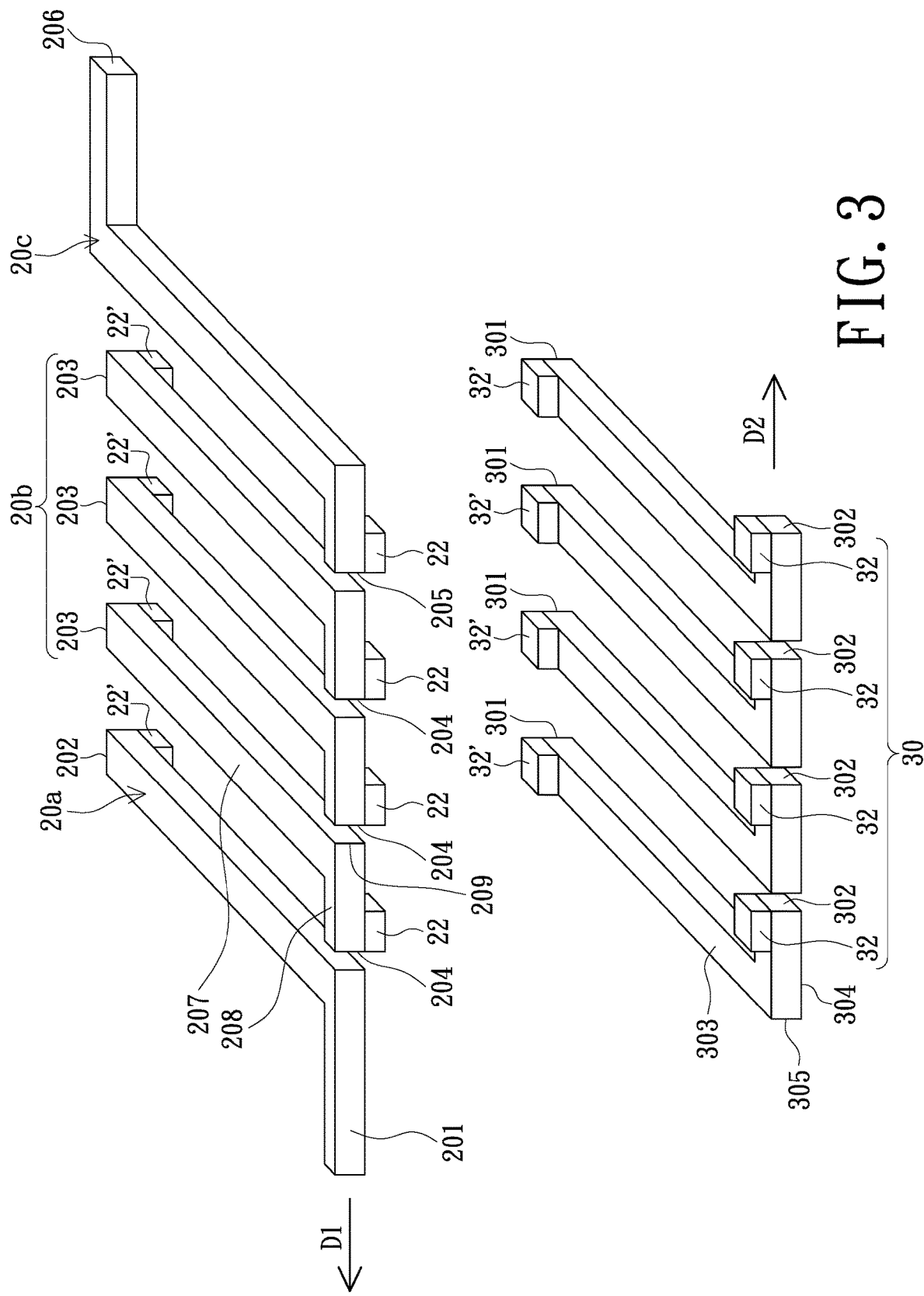
FIG. 3 is a schematic diagram of the configuration of the metal traces and the interconnect structures of the two semiconductor wafers according to a first embodiment of the present invention.
Figure 4:
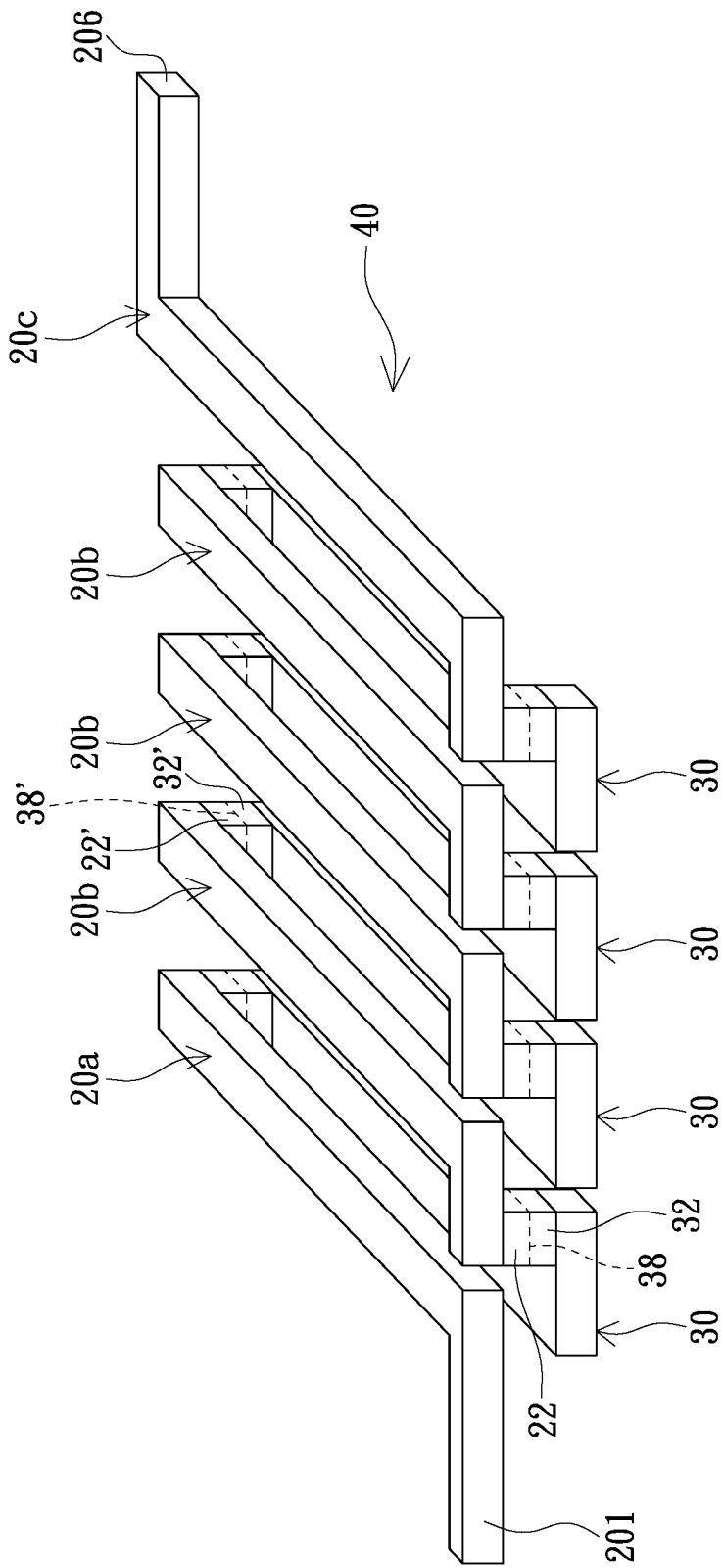
FIG. 4 is a schematic diagram of the metal traces and the interconnect structures of the two semiconductor wafers shown in FIG. 3 after bonding.

FIG. 3 is a schematic diagram of the configuration of the metal traces and the interconnect structures of the two semiconductor wafers according to a first embodiment of the present invention. FIG. 4 is a schematic diagram of the metal traces and the interconnect structures of the two semiconductor wafers shown in FIG. 3 after bonding. As shown in FIG. 3, the quantity of the metal traces of the first inductance layer 18 (labeled in FIGS. 1 and 2) can be plural. For the convenience of description, the plurality of metal traces includes a start metal trace 20*a*, a plurality of first metal traces 20*b* and an end metal trace 20*c*. The start metal trace 20*a*, the first metal traces 20*b* and the end metal trace 20*c* are arranged side by side, and the first metal traces 20*b* are located between the start metal trace 20*a* and the end metal trace 20*c*. The start metal trace 20*a* has an input terminal 201 and a first terminal 202. Each of the first metal traces 20*b* has a first connection terminal 203 and a second connection terminal 204. The end metal trace 20*c* has an end connection terminal 205 and an output terminal 206. In an embodiment as shown in FIG. 3, the input terminal 201, the second connection terminals 204 and the end connection terminal 205 are located on the same side (e.g., located on the first side); and the first terminal 202, the first connection terminals 203 and the output terminal 206 are located on the same side (e.g., located on the second side). The second connection terminals 204 and the end connection terminal 205 are each connected to a first interconnect structure 22; and the first terminal 202 and the first connection terminals 203 are each electrically connected to a first interconnect structure 22'.

Correspondingly, the quantity of the second metal traces of the second inductance layer 28 (labeled in FIGS. 1 and 2) is plural, and the second metal traces 30 are also arranged side by side. Each of the second metal traces 30 has a third connection terminal 301 and a fourth connection terminal 302. The fourth connection terminals 302 are, for example, located on the same side as the input terminal 201 and the second connection terminals 204 (e.g., located on the first side). The fourth connection terminals 302 are each connected to a second interconnect structure 32. The third connection terminals 301 are, for example, located on the same side as the first terminal 202 and the first connection terminals 203 (e.g., located on the second side). The third connection terminals 301 are each connected to a second interconnect structure 32'. In an embodiment, the second interconnect structure 32 electrically connected to the fourth connection terminal 302 of the second metal trace 30 (the one farthest from the start metal trace 20*a*) corresponds to the first interconnect structure 22 electrically connected to the end connection terminal 205 of the end metal trace 20*c*.

Continue the above description. After the first semiconductor wafer 12 (labeled in FIGS. 1 and 2) and the second semiconductor wafer 14 (labeled in FIGS. 1 and 2) are hybrid bonded, the first insulating layer 24 and the second insulating layer 34 form the first bond 36 as shown in FIG. 2, and, in addition, the first interconnect structure 22/22' and the second interconnect structure 32/32' respectively form a second bond 38/38' as shown in FIG. 4. By the second bonds 38 and 38', the start metal trace 20*a*, the first metal traces 20*b*, the second metal traces 30 and the end metal trace 20*c* form a multi-circle continuous and non-intersecting path which constitutes an inductance element 40. The output terminal 206 and the input terminal 201 are respectively functioned as the output terminal and the input terminal of the inductance element 40.

In the above-mentioned first embodiment, the output terminal 206 of the inductance element 40 is located on the first semiconductor wafer 12 as an example. In an embodiment not shown, the end metal trace 20*c* with the output terminal 206 is disposed on the second semiconductor wafer 14. It is understood that in a figure not shown, the end metal trace 20*c* and the second metal traces 30 are arranged side by side, and the end connection terminal 205 of the end metal trace 20*c* is electrically connected with the second metal trace 30 (the one farthest from the start metal trace 20*a*).

In the above-mentioned first embodiment, the first metal trace 20*b* and the second metal trace 30 are L-shaped, the shape of the second metal trace 30 corresponds to the shape of the first metal trace 20*b*, and the first metal trace 20*b* and the second metal trace 30 are arranged backwards. In an embodiment as shown in FIG. 3, specifically, the first metal trace 20*b* has a first long side 207, a first short side 208, and a first bending portion 209 formed between the first long side 207 and the first short side 208. The first short side 208 extends along the first direction D1. The first connection terminal 203 is located at the end of the first long side 207 away from the first bending portion 209. The second connection terminal 204 is located at the end of the first short side 208 away from the first bending portion 209. Correspondingly, the second metal trace 30 has a second long side 303, a second short side 304, and a second bending portion 305 formed between the second long side 303 and the second short side 304. The second short side 304 extends along the second direction D2, wherein the first direction D1 and the second direction D2 are opposite to each other. The third connection terminal 301 is located at the end of the second long side 303 away from the second bending portion 305. The fourth connection terminal 302 is located at the end of the second short side 304 away from the second bending portion 305. As shown in FIGS. 3 and 4, the first long side 207 of the first metal trace 20*b* and the second long side 303 of the second metal trace 30 are in one-to-one correspondence, so that the first interconnect structure 22/22' and the second interconnect structures 32/32' correspond and bond respectively.

Figure 5:
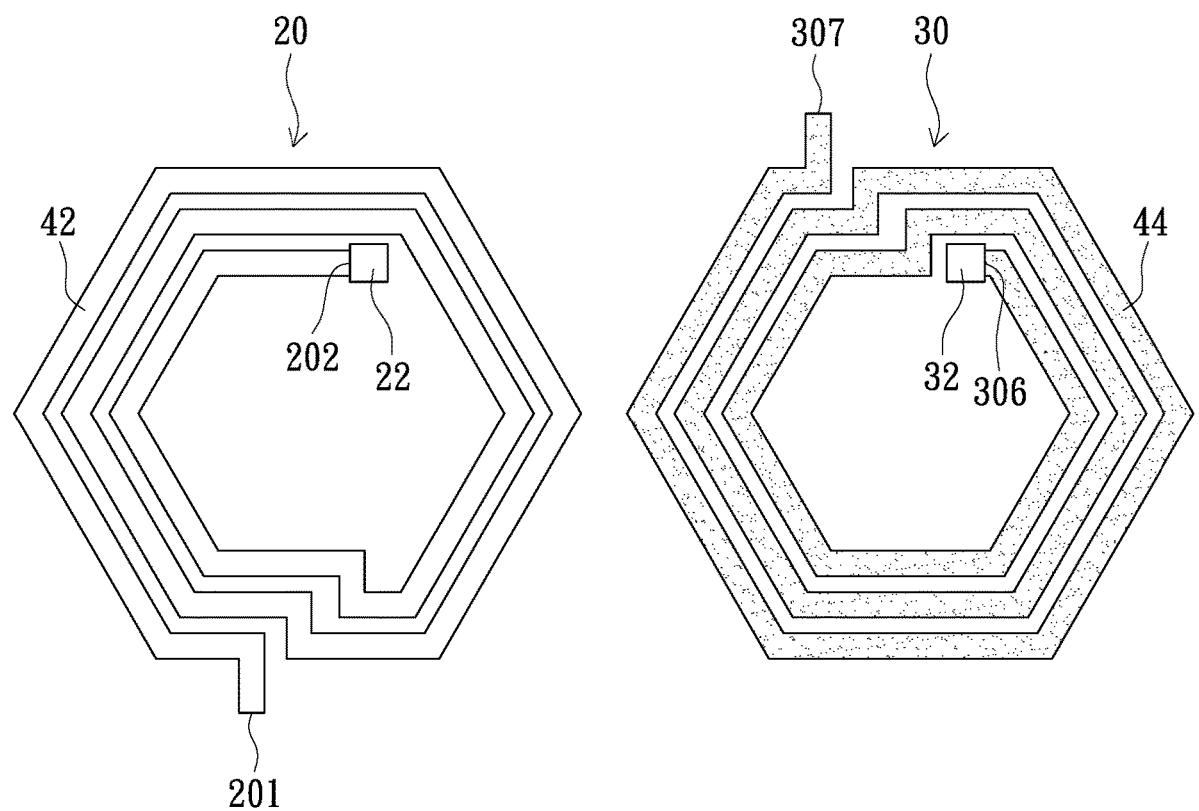
FIG. 5 is a schematic diagram of the configuration of the metal traces and the interconnect structures of the two semiconductor wafers according to a second embodiment of the present invention.
Figure 6:
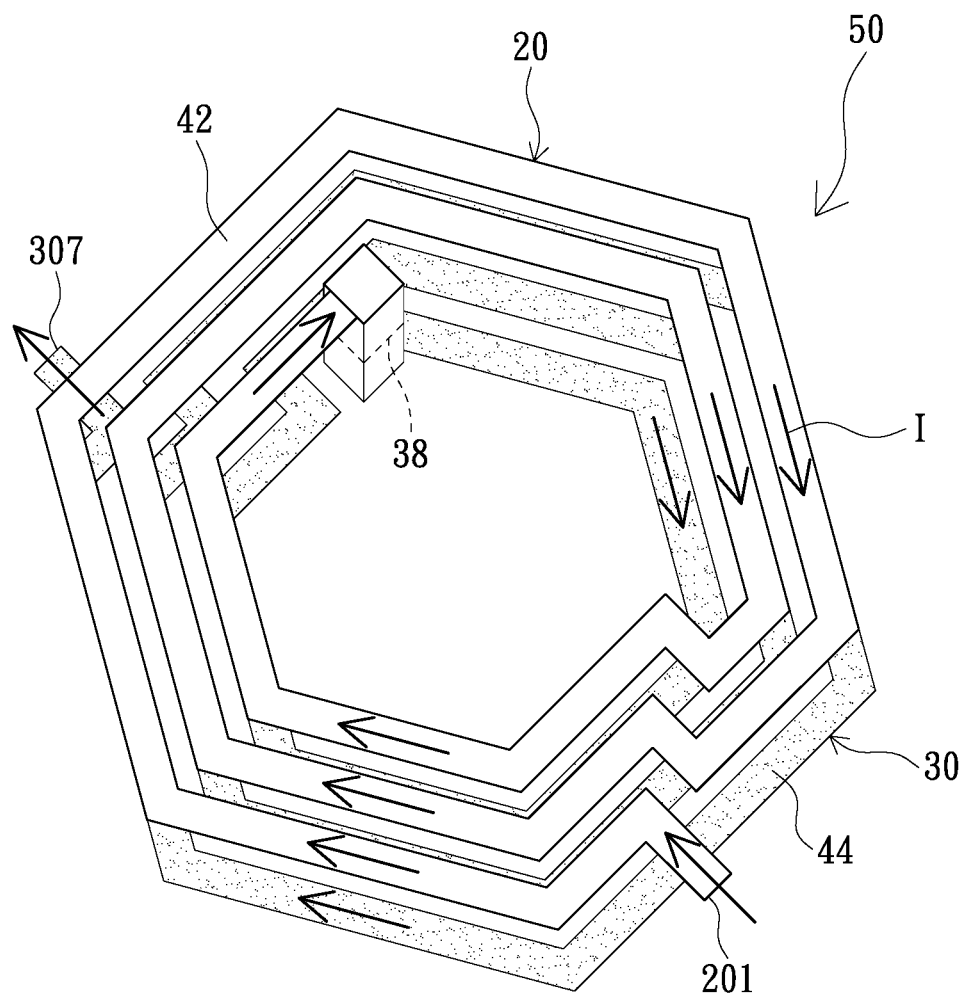
FIG. 6 is a schematic diagram of the metal traces and the interconnect structures of the two semiconductor wafers shown in FIG. 5 after bonding.

FIG. 5 is a schematic diagram of the configuration of the metal traces and the interconnect structures of the two semiconductor wafers according to a second embodiment of the present invention. FIG. 6 is a schematic diagram of the metal traces and the interconnect structures of the two semiconductor wafers shown in FIG. 5 after bonding. As shown in FIG. 5, the first metal trace 20 has an input terminal 201, a first terminal 202, and a first coil 42 that spirals inward from the input terminal 201 to the first terminal 202, for example. The second metal trace 30 has a connection terminal 306, a second terminal 307, and a second coil 44 that spirals outward from the connection terminal 306 to the second terminal 307, for example. The second terminal 307 may function as an output terminal. The quantity of loops and the shape of the first coil 42 roughly correspond to those of the second coil 44. The first interconnect structure 22 is provided at the first terminal 202 of the first metal trace 20, and the second interconnect structure 32 is provided at the connection terminal 306 of the second metal trace 30.

Continue the above description. After the first semiconductor wafer 12 (labeled in FIGS. 1 and 2) and the second semiconductor wafer 14 (labeled in FIGS. 1 and 2) are hybrid bonded, the first insulating layer 24 and the second insulating layer 34 form the first bond 36 as shown in FIG. 2, and, in addition, the first interconnect structure 22 and the second interconnect structure 32 form the second bond 38 as shown in FIG. 6. By the second bond 38, the first coil 42 and the second coil 44 constitute an inductance element 50. The output terminal 206 and the second terminal 307 are respectively functioned as the output terminal and the input terminal of the inductance element 50. In an embodiment, the currents in the first coil 42 and the second coil 44 have the same current flow direction I.

In the above-mentioned second embodiment as shown in FIG. 6, the first coil 42 spirals inward from the input terminal 201 to the first terminal 202, and the second coil 44 spirals outward from the connection terminal 306 to the second terminal 307 (output terminal), so as to form a bond between the inner circle end of the first coil 42 and the inner circle end of the second coil 44; however, the invention is not limited thereto. In an embodiment not shown, the first coil 42 may spiral outward from the input terminal 201 to the first terminal 202, and the second coil 44 may spiral inward from the connection terminal 306 to the second terminal 307 (output terminal), that is, the first interconnect structure 22 and the second interconnect structure 32 form a bond at the outer circle end of the first coil 42 and the outer circle end of the second coil 44.

In the above-mentioned first and second embodiments, by the hybrid bonding of the first semiconductor wafer and the second semiconductor wafer, the conductive traces located on the first semiconductor wafer and the second semiconductor wafer form a continuous and non-intersecting path to form an inductance element with a continuous and non-intersecting path. In addition, the inductance element may produce the required inductance value by adjusting the quantity of discontinuous multi-segment conductive traces or the quantity of loops of the spiral conductive traces in the first semiconductor wafer and the second semiconductor wafer. In addition, the formation of the inductance element has been directly integrated in the back-end process of the wafer and the process of the hybrid bond, and thus, no additional process is required and the effect of simplifying the process is achieved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A semiconductor structure, comprising:
a first semiconductor wafer, comprising a first semiconductor substrate and a first inductance layer, wherein the first inductance layer is disposed on the first semiconductor substrate, one side of the first inductance layer away from the first semiconductor substrate has a first bonding surface, the first inductance layer comprises at least one first metal trace, at least one first interconnect structure and a first insulating layer, the first insulating layer covers the at least one first metal trace, and the at least one first interconnect structure is embedded in the first insulating layer and electrically connected to the at least one first metal trace; and a second semiconductor wafer, comprising a second semiconductor substrate and a second inductance layer, wherein the second inductance layer is disposed on the second semiconductor substrate, one side of the second inductance layer away from the second semiconductor substrate has a second bonding surface, the second inductance layer comprises at least one second metal trace, at least one second interconnect structure and a second insulating layer, the second insulating layer covers the at least one second metal trace, and the at least one second interconnect structure is embedded in the second insulating layer and electrically connected to the at least one second metal trace, wherein, the first semiconductor wafer and the second semiconductor wafer are coupled to each other, the first bonding surface of the first inductance layer is bonded to the second bonding surface of the second inductance layer, the first insulating layer on the first bonding surface and the second insulating layer on the second bonding surface form a first bond, and the at least one first interconnect structure on the first bonding surface and the at least one second interconnect structure on the second bonding surface form a second bond, wherein the at least one first metal trace has an input terminal and a first terminal, the at least one second metal trace corresponds to the at least one first metal trace, and the at least one second metal trace has a connection terminal and a second terminal, wherein the at least one first interconnect structure is electrically connected to the first terminal, the at least one second interconnect structure is electrically connected to the connection terminal, the second bond is formed by the at least one second interconnect structure and the at least one first interconnect structure, and the at least one first metal trace, the at least one first interconnect structure, the at least one second metal trace and the at least one second interconnect structure form a continuous and non-intersecting path between the input terminal and the second terminal and constitute an inductance element.

2. The semiconductor structure according to claim 1, wherein the at least one first metal trace comprises a first coil spiraling inward from the input terminal to the first terminal, the at least one second metal trace comprises a second coil spiraling outward from the connection terminal to the second terminal, and the second terminal functions as an output terminal.

3. The semiconductor structure according to claim 1, wherein the at least one first metal trace comprises a first coil spiraling outward from the input terminal to the first terminal, the at least one second metal trace comprises a second coil spiraling inward from the connection terminal to the second terminal, and the second terminal functions as an output terminal.

4. The semiconductor structure according to claim 2, wherein the first coil and the second coil are arranged correspondingly, and the first coil and the second coil have a same current flow direction.

5. The semiconductor structure according to claim 3, wherein the first coil and the second coil are arranged correspondingly, and the first coil and the second coil have a same current flow direction.

6. The semiconductor structure according to claim 1, wherein the at least one first interconnect structure and the at least one first metal trace are integrally formed, and the at least one second interconnect structure and the at least one second metal trace are integrally formed.

7. A semiconductor structure, comprising:
a first semiconductor wafer, comprising a first semiconductor substrate and a first inductance layer, wherein the first inductance layer is disposed on the first semiconductor substrate, one side of the first inductance layer away from the first semiconductor substrate has a first bonding surface, and the first inductance layer comprises a start metal trace, a plurality of first metal traces, a plurality of first interconnect structures and a first insulating layer, wherein
the start metal trace and the plurality of first metal traces are arranged side by side, the start metal trace has an input terminal and a first terminal, and each of the plurality of first metal traces has a first connection terminal and a second connection terminal,
the first insulating layer covers the start metal trace and the plurality of first metal traces,
the plurality of first interconnect structures are embedded in the first insulating layer, and the first terminal, each of the first connection terminals, and each of the second connection terminals are each electrically connected to one of the plurality of first interconnect structures; and a second semiconductor wafer, comprising a second semiconductor substrate and a second inductance layer, wherein the second inductance layer is disposed on the second semiconductor substrate, one side of the second inductance layer away from the second semiconductor substrate has a second bonding surface, and the second inductance layer comprises a plurality of second metal traces, a plurality of second interconnect structures and a second insulating layer, wherein
the plurality of second metal traces are arranged side by side, and each of the plurality of second metal traces has a third connection terminal and a fourth connection terminal,
the second insulating layer covers the plurality of second metal traces,
the plurality of second interconnect structures are embedded in the second insulating layer, and the third connection terminals and the fourth connection terminals are each electrically connected to one of the plurality of second interconnect structures,
wherein, the first semiconductor wafer and the second semiconductor wafer are coupled to each other, the first bonding surface of the first inductance layer is bonded to the second bonding surface of the second inductance layer, the first insulating layer on the first bonding surface and the second insulating layer on the second bonding surface form a first bond, the plurality of first interconnect structures on the first bonding surface and the plurality of second interconnect structures on the second bonding surface respectively form a second bond, and the start metal trace, the plurality of first metal traces, the plurality of first interconnect structures, the plurality of second metal traces and the plurality of second interconnect structures form a multi-circle continuous and non-intersecting path and constitute an inductance element.

8. The semiconductor structure according to claim 7, wherein the first inductance layer further comprises an end metal trace, the end metal trace and the plurality of first metal traces are arranged side by side, one end of the end metal trace is electrically connected to the one of the plurality of second metal traces farthest from the start metal trace, the other end of the end metal trace functions as an output terminal, so that the start metal trace, the plurality of first metal traces, the plurality of first interconnect structures, the plurality of second metal traces, the plurality of second interconnect structures and the end metal trace form a multi-circle continuous and non-intersecting path between the input terminal and the output terminal.

9. The semiconductor structure according to claim 7, wherein the second inductance layer further comprises an end metal trace, the end metal trace and the plurality of second metal traces are arranged side by side, one end of the end metal trace is electrically connected to the one of the plurality of second metal traces farthest from the start metal trace, the other end of the end metal trace functions as an output terminal, so that the start metal trace, the plurality of first metal traces, the plurality of first interconnect structures, the plurality of second metal traces, the plurality of second interconnect structures and the end metal trace form a multi-circle continuous and non-intersecting path between the input terminal and the output terminal.

10. The semiconductor structure according to claim 7, wherein each of the plurality of first metal traces is L-shaped and comprises a first long side, a first short side, and a first bending portion formed between the first long side and the first short side, the first short side extends along a first direction, the first connection terminal is located at an end of the first long side away from the first bending portion, and the second connection terminal is located at an end of the first short side away from the first bending portion.

11. The semiconductor structure according to claim 10, wherein a shape of each of the plurality of second metal traces corresponds to that of the plurality of first metal traces and is arranged backwards with the plurality of first metal traces, each of the plurality of second metal traces comprises a second long side, a second short side, and a second bending portion formed between the second long side and the second short side, the second short side extends along a second direction opposite to the first direction, the third connection terminal is located at an end of the second long side away from the second bending portion, and the fourth connection terminal is located at an end of the second short side away from the second bending portion.

* * * * *